US008058942B2

(12) United States Patent
Hammond et al.

(10) Patent No.: US 8,058,942 B2
(45) Date of Patent: Nov. 15, 2011

(54) DUAL REFERENCE OSCILLATOR PHASE-LOCK LOOP

(75) Inventors: Paul Hammond, Linlithgow (GB); Jim Brown, Livingston (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 75 days.

(21) Appl. No.: 12/653,093

(22) Filed: Dec. 8, 2009

(65) Prior Publication Data

US 2011/0084768 A1    Apr. 14, 2011

Related U.S. Application Data

(60) Provisional application No. 61/278,699, filed on Oct. 8, 2009.

(51) Int. Cl.
*H03B 1/00* (2006.01)

(52) U.S. Cl. ......... 331/177 R; 331/16; 331/18; 331/34; 327/156

(58) Field of Classification Search ............. 331/16, 331/34, 177 R, 18; 327/156
See application file for complete search history.

(56) References Cited

U.S. PATENT DOCUMENTS

| 5,420,545 | A | 5/1995 | Davis et al. |
| 5,767,746 | A | 6/1998 | Dieterich |
| 5,790,615 | A | 8/1998 | Beale et al. |
| 6,008,703 | A * | 12/1999 | Perrott et al. ............. 332/100 |
| 6,894,571 | B2 | 5/2005 | Sumi et al. |
| 6,946,884 | B2 | 9/2005 | Holland et al. |
| 7,205,848 | B2 | 4/2007 | Cordos et al. |
| 2007/0132515 | A1 | 6/2007 | Lee et al. |

OTHER PUBLICATIONS

Co-pending U.S. Appl. No. 12/592,598, filed Nov. 30, 2009, Digital Controller for Automatic Rate Detection and Tracking of Audio Interface Clocks, assigned to the same assignees as the present invention.

* cited by examiner

*Primary Examiner* — Arnold Kinkead
(74) *Attorney, Agent, or Firm* — Saile Ackerman LLC; Stephen B. Ackerman; Billy Knowles

(57) ABSTRACT

A phase-locked loop has a stable high frequency reference oscillator to provide a stable high frequency reference signal that has reference frequency that is a small submultiple of a generated frequency of a voltage controlled oscillator within the phase-locked loop. An adjustable output frequency feedback circuit has with a feedback divide ratio that is approximately the small submultiple and adjusts the feedback ratio such that the generated frequency of the voltage controlled oscillator is locked to a stable low frequency reference input signal. The feedback divide ratio is adjusted as a function of a required ratio change value that is a function of a current phase error of the generated frequency of a voltage controlled oscillator and the stable low frequency reference input signal and a phase error derivative. The phase error derivative is a difference of the current phase error and a previous phase error.

17 Claims, 4 Drawing Sheets

DUAL REFERENCE OSCILLATOR PHASE-LOCK LOOP

This application claims priority under 35 U.S.C. §119 to U.S. Provisional Patent Application Ser. No. 61/278,699, filed on Oct. 8, 2009, assigned to the same assignee as the present invention, and incorporated herein by reference in its entirety.

RELATED PATENT APPLICATIONS

"Digital Controller for Automatic Rate Detection and Tracking of Audio Interface Clocks," Ser. No. 12/592,589, Filing Date Nov. 30, 2009, assigned to the same assignee as this invention.

BACKGROUND OF THE INVENTION

1. Field of the Invention

The present invention relates to phase-locked loop circuits. More particularly, the present invention relates to phase-locked loops having dual reference oscillators.

2. Description of Related Art

As is known in the art, a Phase-Locked Loop (PLL) is a closed-loop circuit that compares the phase of the output signal with the phase of an incoming reference signal. The circuit adjusts itself until the two signals are phase aligned and is thus considered to have the output in phase lock with the input reference signal. Once the loop is locked the phase difference between the output signal and the input signal is very close to zero. The frequency of the output signal is an integer or fractional multiple of the input reference signal's frequency.

Referring to FIG. 1, a phase-locked loop 5 has a stable reference oscillator 10 that provides the incoming reference signal 12 that is compared with the output signal $f_{OUT}$ 35. The output 12 of the reference oscillator 10 is an input to a phase/frequency detector and charge pump circuit 15. The phase/frequency detector and charge pump circuit 15 determines the phase error between the incoming reference signal 12 and the output signal $f_{OUT}$ 35 and provides an output phase error voltage that is an input to the charge pump. The phase error is converted by the charge pump into a correction current that is transferred to the loop filter 20. The loop filter 20 generates a control voltage that varies the frequency of the voltage controlled oscillator 25. The output of the voltage controlled oscillator 25 is the output signal $f_{OUT}$ 35. The output signal $f_{OUT}$ 35 fed in to the feedback divider 30. The feedback divider 30 divides or multiplies the output signal $f_{OUT}$ 35 to create the feedback signal 32 that is compared in the phase/frequency detector and charge pump circuit 15 to generate the correction current. When the phase error has been reduced to zero, the voltage controlled oscillator 25 is not varied and the phase-locked loop 5 is considered locked.

Integrated systems typically have a stable reference oscillator 10 acting as the main system clock. Individual devices within the system use the phase-locked loop 5 to derive their internal clock(s) from the stable master reference oscillator 10. In order to save cost and/or power it is often desirable to use a low-frequency source such as a watch crystal oscillator as the master reference oscillator 10. Using a low-frequency reference imposes a serious limitation on the bandwidth of the phase-locked loop. For an integrated circuit (IC) phase-locked loop 5, this either requires off-chip components or digital filters to achieve a sufficiently low bandwidth.

SUMMARY OF THE INVENTION

An object of this invention is to provide a phase-locked loop having an output frequency feedback circuit with a relatively small feedback divide ratios and sufficiently low bandwidth.

To accomplish at least this object, a phase-locked loop includes a reference oscillator to provide a stable high frequency reference input signal. The phase-locked loop further includes a feedback divider ratio adjustment circuit. The feedback divider ratio adjustment circuit receives an output signal from a voltage controlled oscillator of the phase-locked loop. The feedback divider ratio adjustment circuit scales a frequency of the output signal of the voltage controlled oscillator by a first integer factor (N). The scaled output signal is used to increment a counter which is the input of a capture register that is within the feedback divider ratio adjustment circuit that is clocked by a stable low frequency reference input signal. The stable low frequency reference input signal increments a compare register by a second integer factor (K). The feedback divider ratio adjustment circuit then subtracts the contents of the compare register from the contents of the capture register to determine a phase error between the output signal of the voltage controlled oscillator and the stable low frequency reference input signal.

The feedback divider ratio adjustment circuit retains a previous phase error that is compared with the current phase error to determine a phase error derivative. The feedback divider ratio adjustment circuit then calculates a required ratio change value from the phase error and the phase error derivative. The required ratio change value adjusts the feedback divider until the phase-locked loop reaches synchronization and the frequency of the voltage controlled oscillator is equal to the product of the first integer factor and the second integer factor multiplied times the frequency of the stable low frequency reference input signal.

In some embodiments, the required ratio change value is applied to a sigma delta modulator. The sigma delta modulator receives a feedback signal from the feedback divider that acts as a timing signal for the sigma delta modulator. The output of the sigma delta modulator is the adjustment signal for the feedback divider to synchronize the output of the voltage controlled oscillator to the stable low frequency reference input signal.

In other embodiments, the feedback divider ratio adjustment circuit determines a scaling ratio for a feedback divider of a phase-locked loop to generate a feedback signal that is a pre-scaled output signal of a voltage controlled oscillator of the phase-locked loop. The feedback divider ratio adjustment circuit has a capture counter that is incremented based on a first integer factor (N) of the frequency of the output signal of the voltage controlled oscillator. The feedback divider ratio adjustment circuit receives a stable low frequency reference input signal that is used to clock a capture register to capture the capture count of capture counter. The stable low frequency reference input signal further clocks a compare register that is incremented by a second integer factor.

The feedback divider ratio adjustment circuit has a phase comparator that receives the contents of the capture register and the compare register and determines a current phase error as the difference between the contents of the capture register and the compare register.

A phase derivative circuit retains a previous phase error and compares the previous phase error with the current phase error to determine a phase error derivative. The current phase error and the phase error derivative are then used to determine a required ratio change value. The required ratio change value adjusts the feedback divider until the phase-locked loop reaches synchronization and the frequency of the voltage controlled oscillator is equal to the product of the first integer factor and the second integer factor multiplied times the frequency of the stable low frequency reference input signal.

DETAILED DESCRIPTION OF THE INVENTION

As described above, the use of a low-frequency reference input signal to a phase-locked loop imposes a serious limitation on the bandwidth of the PLL. In a classic design of the prior art an integrated circuit phase-locked loop requires either off-chip components or digital filters to achieve the sufficiently low bandwidth. Furthermore, the required large feedback divide ratios for a phase-locked loop having a very high frequency output signal relative to the low frequency reference input signal that are make the phase-locked loop susceptible to reference noise. The phase-locked loop of this invention solves these problems by integrating a stabile high frequency reference oscillator together with a feedback divider ratio adjustment circuit with the phase-locked loop provide a phase-locked loop having an output frequency feedback circuit with a relatively small feedback divide ratios and sufficiently low bandwidth.

Figure 1:
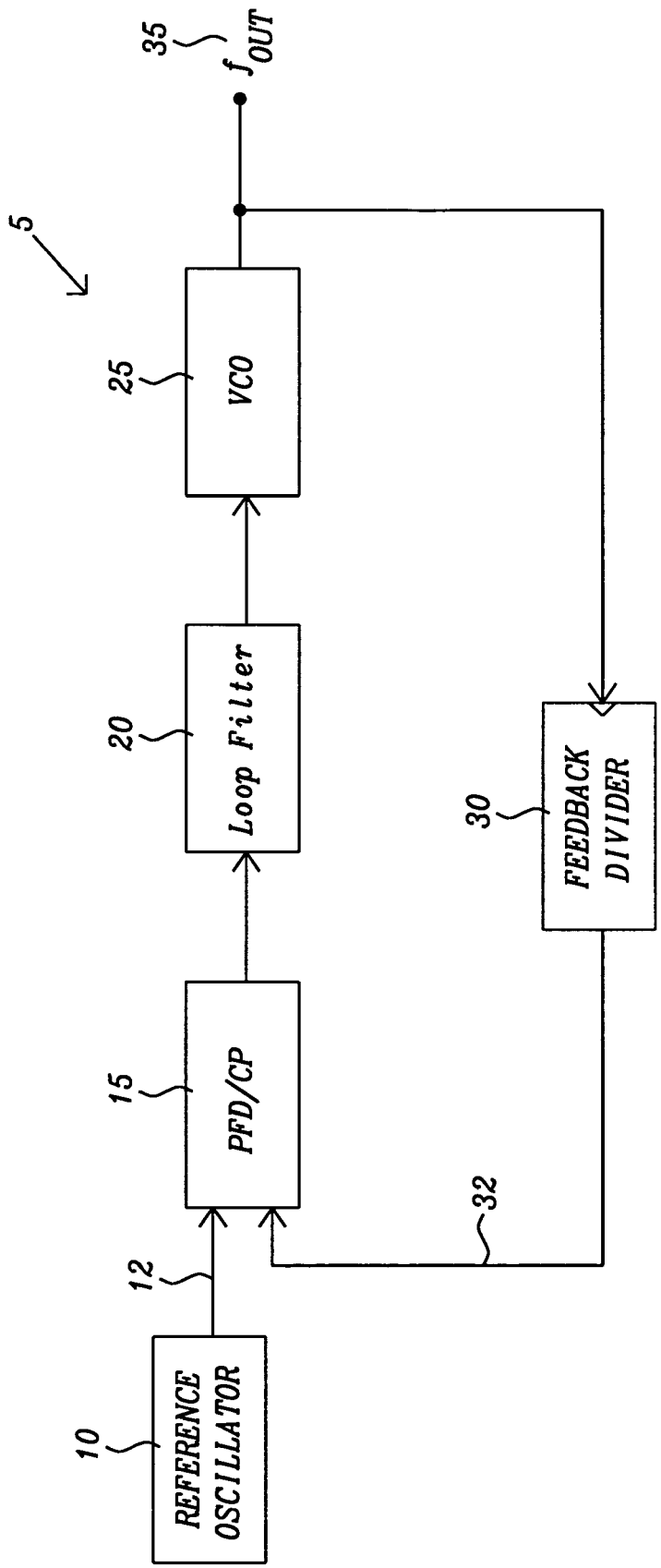
FIG. 1 is a block diagram of a phase-locked loop of the prior art.
Figure 2:
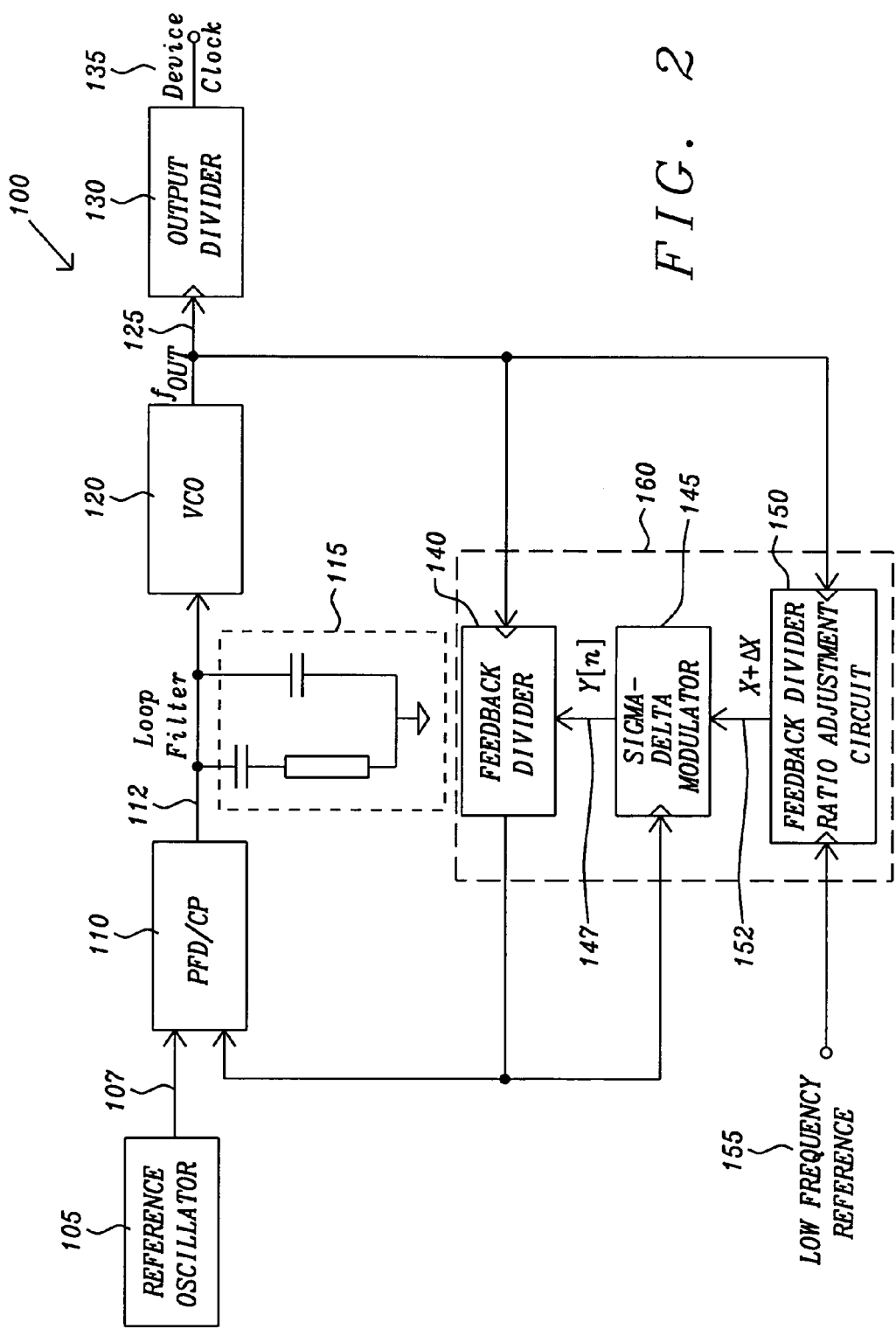
FIG. 2 is a block diagram of an embodiment of a phase-locked loop.

FIG. 2 provides a block diagram of an embodiment of a phase-locked loop. Referring to FIG. 2, a phase-locked loop 100 includes a reference oscillator 105 to is provide a stable high frequency reference input signal 107 to a phase/frequency detector and charge pump circuit 110. The output of the phase/frequency detector and charge pump circuit 110 is applied to a loop filter 115 that filter out the high frequency component of a phase error signal 112 between the output signal $f_{OUT}$ 125 and the stable high frequency reference input signal 107. The filtered phase error signal 112 is a correction voltage level that adjusts the oscillation frequency of the voltage controlled oscillator 120 to generate the output signal $f_{OUT}$ 125. The output signal $f_{OUT}$ 125 is an input to the output divider circuit 130 that is used to create the necessary signal conditioning for the device clocks 135 that are distributed within an electronic system The output signal $f_{OUT}$ 125 fed to an adjustable ratio feedback divider 160. The adjustable ratio feedback divider 160 divides or multiplies the output signal $f_{OUT}$ 125 to create the feedback signal 142 that is compared in the phase/frequency detector and charge pump circuit 110 to generate the phase error signal 112. When the phase error signal 112 has been reduced to zero, the voltage controlled oscillator 120 is not varied and the phase-locked loop 100 is considered locked. To lock output signal $f_{OUT}$ 125 to a low frequency reference signal 155, the feedback divider ratio of the adjustable ratio feedback divider 160 must be adjusted such that the frequency of the output signal $f_{OUT}$ 125 is a multiple of the stable low frequency reference input signal 155.

Within the adjustable ratio feedback divider 160, a feedback divider ratio adjustment circuit 150 is in communication with a feedback divider 140 to provide a required ratio change value to the feedback divider 140 to appropriately set the feedback signal 142 to correctly set the phase error signal 112 to lock the phase-locked loop 100. The feedback divider ratio adjustment circuit 150 receives the output signal $f_{OUT}$ 125 from a voltage controlled oscillator 120. The feedback divider ratio adjustment circuit 150 scales a frequency of the output signal $f_{OUT}$ 125 by a first integer factor (N). The scaled output signal is used to increment a counter which is the input of a capture register that is within the feedback divider ratio adjustment circuit 150 (discussed hereinafter in more detail) that is clocked by a stable low frequency reference input signal 155. The stable low frequency reference input signal 155 increments a compare register by a second integer factor (K). The feedback divider ratio adjustment circuit 140 then subtracts the contents of the compare register from the contents of the capture register to determine a phase error (PE) between the output signal $f_{OUT}$ 125 of the voltage controlled oscillator and the stable low frequency reference input signal 155.

The feedback divider ratio adjustment circuit 140 retains a previous phase error that is compared with the current phase error to determine a phase error derivative (PE'). The feedback divider ratio adjustment circuit 140 then calculates a required ratio change value (X+ΔX) 152 from the phase error and the phase error derivative. The required ratio change value 152 is applied to a sigma delta modulator 145. The sigma delta modulator 145 receives the feedback signal 142 from the feedback divider 140 that acts as a timing signal for the sigma delta modulator 145. The output (Y[n]) 147 of the sigma delta modulator 145 is the adjustment signal for the feedback divider 140 to synchronize the output signal $f_{OUT}$ 125 of the voltage controlled oscillator 120 to the stable low frequency reference input signal 155. The required ratio change value 152 adjusts the feedback divider 140 until the phase-locked loop 100 reaches synchronization and the frequency of the voltage controlled oscillator 120 is equal to the product of the first integer factor (N) and the second integer factor (K) multiplied times the frequency of the stable low frequency reference input signal 155.

The feedback divider 140 functions by dividing the output signal $f_{OUT}$ 125 by a ratio value that is controlled by the sigma delta modulator 145. The sigma delta modulator 145 output hops around in a chaotic fashion such that its average value is equal to required divide ratio (X+ΔX) 152. The ratio change value (ΔX) 152 updates at a much lower rate—well below the PLL bandwidth to maintain stability, and in some audio embodiments below the audio bandwidth so as not to produce audible artifacts.

Figure 3:
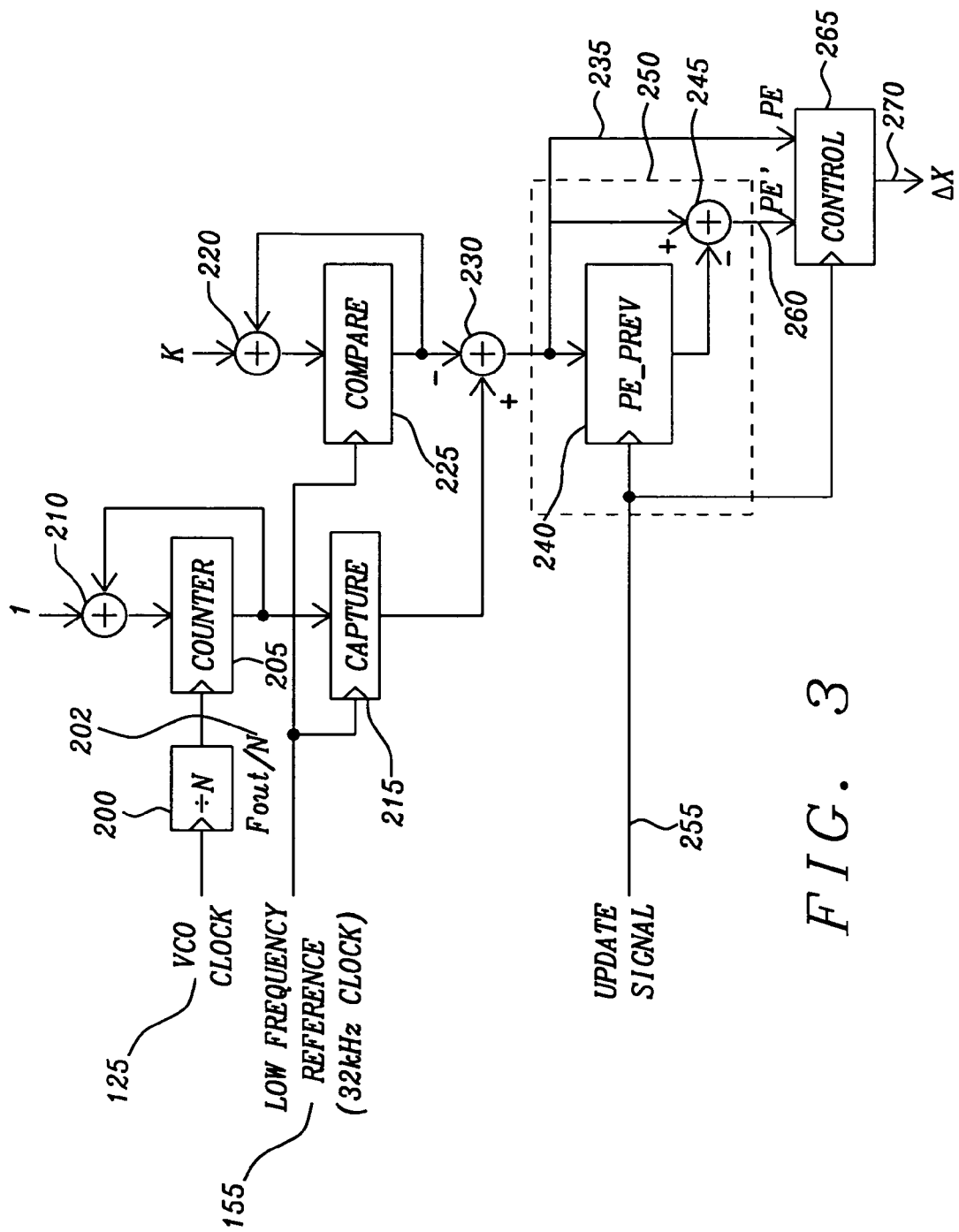
FIG. 3 is a block diagram of a feedback divider ratio adjustment circuit as incorporated in the embodiment of FIG. 2.

Refer now to FIG. 3 for a discussion of the structure and operation of the feedback divider ratio adjustment circuit 150. The output signal $f_{OUT}$ 125 is an input to a prescaler circuit 200. The prescaler circuit 200 divides the frequency of the output signal $f_{OUT}$ 125 by the first integer factor (N). The prescaled output signal ($f_{OUT}$/N) 202 is the clocking input to the capture counter 205. The capture counter 205 is incremented by the adder 210.

The stable low frequency reference input signal 155 is the clocking input to a capture register 215. At each cycle of the stable low frequency reference input signal 155, the capture register 215 acquires the count value of the capture counter 205 to determine the number of prescaled output signal ($f_{OUT}$/N) 202 cycles within a single cycle of the stable low frequency reference input signal 155. At the same time, the stable low frequency reference input signal 155 is the clocking input to the compare register 225. The compare register 225 receives a count that is increased by the second integer factor (K). The contents of the compare register 225 are iteratively added to the second integer factor (K) in the adder 220. A current phase error (PE) 235 is determined by determining the difference of the contents of the capture register 215 and the compare register 225 in the difference circuit 230.

A phase error derivative circuit 250 determines a phase error derivative (PE') 260. Each current phase error (PE) 235 is retained in previous phase error register 240 within the phase error derivative circuit 250. The previous phase error register 240 is updated with an update signal 255. The previous phase error is extracted from the previous phase error register 240 and compared with the current phase error 235 in the difference circuit 245. The phase error (PE) 235 and the phase error derivative (PE') 260 are the inputs to the control circuit 265. The control circuit 265 is clocked with the update signal 255 to generate the required ratio change value ($\Delta X$) 270. The required ratio change value ($\Delta X$) 270 determines the amount of the change in the feedback divider ratio to provide the necessary change in the feedback signal 142 of FIG. 2 force the voltage control oscillator 120 into synchronization with the stable low frequency reference input signal 155.

The ratio change value ($\Delta X$) is calculated as KP*PE+ KD*PE'. The constant KP is the proportional gain factor, and the constant KD is the differential gain factor so that the control circuit 265 calculates the ratio change value ($\Delta X$) as a proportional plus differential (PD) controller. In other embodiments, the control circuit 265 calculates the ratio change value ($\Delta X$) as a proportional plus integral (PI) or a proportional plus integral plus differential (PID) controller. In the embodiments, employing a PI or a PID controller the integral of phase error must be calculated as well.

When the phase-locked loop 100 of FIG. 2 has achieved synchronization with the stable low frequency reference input signal 155, the phase error (PE) 235 will approach zero, which implies that the number of cycles of the output signal $f_{OUT}$ 125 for each cycle of the stable low frequency reference input signal 155 is equal to the product of the first integer factor (N) multiplied by the second integer factor (K). ($f_{OUT}=N \times K \times f_{LOW}$).

While the embodiments as described generally refer to electronic circuitry specifically designed for performing as a phase-locked loop having a feedback divider circuit with an adjustable divider ratio. In other embodiments, the phase-locked loop function may be executed as digital code that when executed on a computer processor such as a digital signal processor performs the function of locking an output signal to a stable low frequency reference input signal. In these embodiments, the feedback divider function must also have the ability to vary the divider ratio of the feedback divider function.

Figure 4:
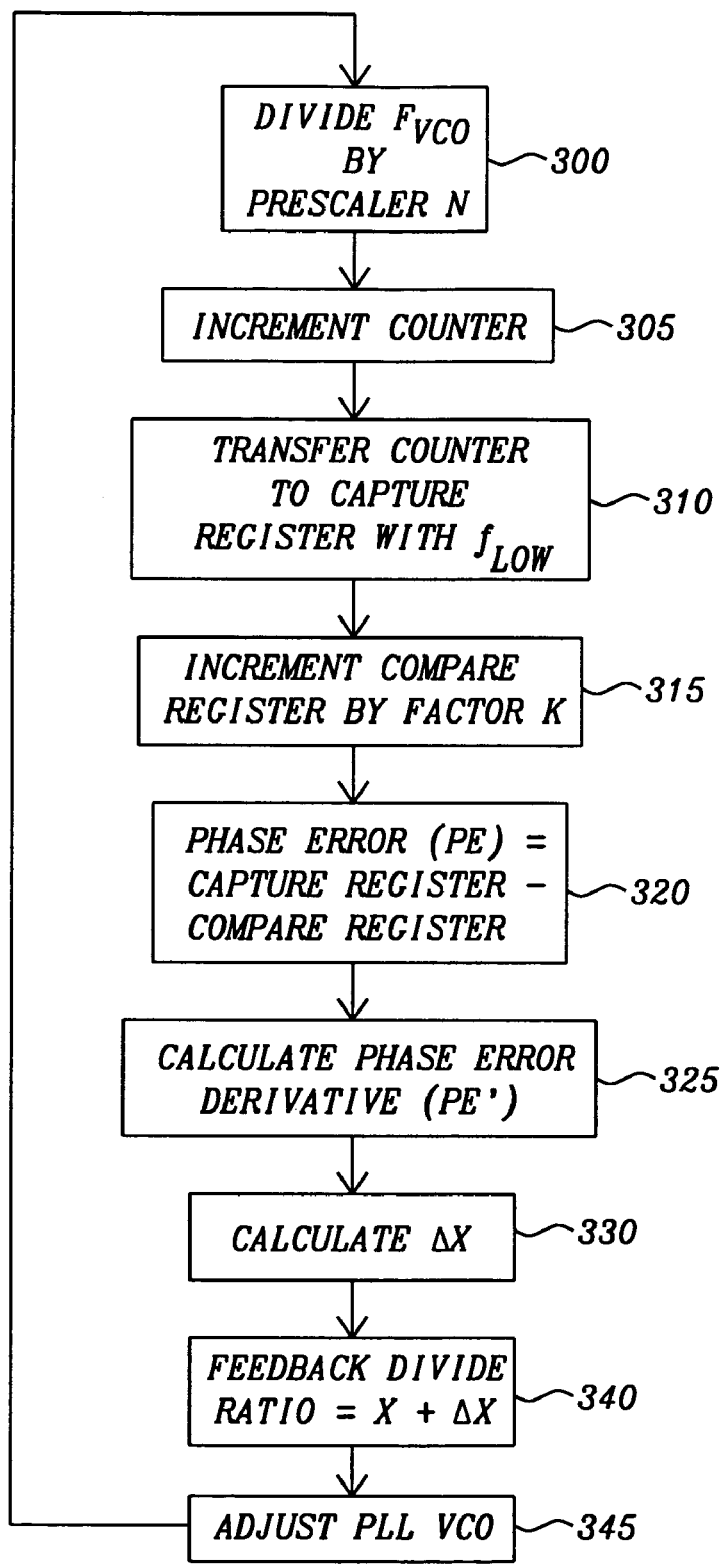
FIG. 4 is a flow chart for a method of the adjustment of a feedback divider ratio for a phase-locked loop.

Refer now to FIG. 4 for an explanation of a method for varying a feedback ratio of a feedback divider that may be implemented as a distinct analog or digital circuit or implemented as a program process within a digital signal processor. An output signal $f_{OUT}$ of a voltage controlled oscillator is prescaled (Box 300) by dividing the output signal $f_{OUT}$ by a first integer value N. The prescaled output signal $f_{OUT}$ provides a timing value for incrementing (Box 305) a capture counter according to a cycle time of the prescaled output signal $f_{OUT}$. The value of the capture counter is transferred (Box 310) to a capture register with a time interval that is the cycle time of a stable low frequency reference input signal $f_{LOW}$. The stable low frequency reference input signal $f_{LOW}$ is used to increment (Box 315) a compare register by a second integer factor K. The phase error (PE) between the output signal $f_{OUT}$ of the voltage controlled oscillator and the stable low frequency reference input signal $f_{LOW}$ is calculated (Box 320) by comparing a difference of the contents of the capture register and compare register. A phase error derivative (PE') is calculated (Box 325) as difference between a retained previous phase error and the current phase error. A required ratio change value ($\Delta X$) is calculated (Box 330) as a function of the current phase error (PE) and the phase error derivative (PE'). The feedback divide ratio is adjusted (Box 340) according to the required ratio change value ($\Delta X$) and the voltage controlled oscillator is adjusted (Box 345) based on the new feedback divide ratio as compared to a stable high frequency reference input signal $f_{HIGH}$. The process is iterated until the required ratio change value ($\Delta X$) has remained constant, or nearly constant, for a length of time at which time the phase-locked loop is considered synchronized to the stable low frequency reference input signal $f_{LOW}$. The degree to which $\Delta X$ is allowed to vary and the length of time for which it should remain constant is dependant upon the required accuracy and response, time of the system. The process continues to be iterated to ensure that the phase-locked loop remains synchronized.

The ratio change value ($\Delta X$) is calculated as KP*PE+ KD*PE'. The constant KP is the proportional gain factor, and the constant KD is the differential gain factor. In some embodiments of apparatus for executing the method for varying a feedback ratio of a feedback divider the calculation of the ratio change value ($\Delta X$) is accomplished with a proportional plus differential (PD) controller. In other embodiments of apparatus for executing the method for varying a feedback ratio of a feedback divider the calculation of the ratio change value ($\Delta X$) is accomplished with using a proportional plus integral (PI) or a proportional plus integral plus differential (PID) controller. In the embodiments, employing a PID controller the integral of phase error must be calculated as well.

In an example of the operation of a phase-locked loop having an adjustable feedback divide ratio, an analogue PLL with a VCO frequency of 100 MHz is designed to operate from a 10 MHz reference frequency. The feedback divide ratio is obviously 10, and the loop bandwidth can be chosen to suit noise and area requirements—in this case a bandwidth of 200 KHz is chosen. In addition, the system must also support a standard 32 KHz (actually 32.768 KHz) watch crystal reference. If the standard 32 KHz watch crystal reference were used in the phase-locked loop without the higher stable frequency reference of 10 MHz, the phase-locked loop would need to be modified, firstly to reduce the loop bandwidth to 3 KHz for stability, and secondly to increase the feedback divide ratio to approximately 3050. These modifications are not desirable for area and noise reasons and would further require larger external components. If instead a reference oscillator with a nominal frequency of 10 MHz is added to the system, the phase-locked loop can be implemented within the area of an integrated circuit with no external circuitry. The 32 KHz clock is fed to the feedback divider ratio adjustment circuit 150 of FIG. 2 which updates the feedback divide ratio to the feedback divider 140 to appropriately set the feedback signal 142 to correctly set the phase error signal 112 to lock the voltage controlled oscillator 120 frequency to a known fixed multiple of the standard 32 KHz watch crystal reference. Note that it is not necessary to know the exact frequency of the stable high frequency reference input signal $f_{HIGH}$ since the voltage controlled oscillator is locked to the standard 32 KHz watch crystal reference.

An advantage of a phase-locked loop having dual stable reference input signals and an adjustable ratio feedback divider circuit is that it does not require a low-bandwidth phase-locked loop to accept the low-frequency reference input signal. This means that external components (or equivalent digital circuits) are not required to implement the low-bandwidth loop filter. It also means that a reasonable feedback divide ratio between VCO and reference oscillator can be maintained, instead of the huge divide ratios that are required with a single low-frequency reference input signal. More significantly, a digital controller implementing a method for varying a feedback ratio of a feedback divider within a phase-locked loop may already be required in a sample-rate matching scheme, so the only additional component required is the reference oscillator.

By implementing an on-chip stable high frequency reference oscillator $f_{HIGH}$ from as few active components as possible and allowing it to run at its natural frequency, it can have much lower phase noise than the voltage controlled oscillator within the phase-locked loop. Since the stable high frequency reference oscillator $f_{HIGH}$ runs much faster than the external stable low frequency reference input signal $f_{LOW}$, the feedback divide ratio can be much lower than if the phase-locked loop used the stable is low frequency reference input signal $f_{LOW}$ directly. This makes the phase-locked-loop much less sensitive to reference noise. So although the on-chip stable high frequency reference oscillator $f_{HIGH}$ will have higher noise than an external crystal-derived reference, the output noise of the PLL can in fact be lower.

While this invention has been particularly shown and described with reference to the preferred embodiments thereof, it will be understood by those skilled in the art that various changes in form and details may be made without departing from the spirit and scope of the invention.

The invention claimed is:

1. A phase-locked loop comprising
   a stable high frequency reference oscillator to provide a stable high frequency reference signal that has reference frequency that is a small submultiple of a generated frequency of a voltage controlled oscillator within the phase-locked loop; and
   an adjustable output frequency feedback circuit with a feedback divide ratio that is approximately the small submultiple and adjusts the feedback ratio such that the generated frequency of the voltage controlled oscillator is locked to a stable low frequency reference input signal;
   wherein the feedback divide ratio is adjusted as a function of a required ratio change value that is a function of a current phase error of the generated frequency of a voltage controlled oscillator and the stable low frequency reference input signal and a phase error derivative that is is a difference of the current phase error and a previous phase error.

2. The phase-locked loop of claim 1 wherein the stable low frequency reference input signal is generated by a 32.768 kHz watch crystal.

3. A phase-locked loop comprising
   a reference oscillator to provide a stable high frequency reference input signal;
   an adjustable ratio feedback divider circuit in communication with a voltage controlled oscillator of the phase-locked loop to receive an output signal and divides the frequency of output signal by a feedback divide ratio to generate a feedback signal that is applied to a phase-frequency detector and charge pump and compared with the stable high frequency reference signal to generate a phase error that determines a difference in the frequency of the output signal with that of the stable high frequency reference input signal to adjust the voltage controlled oscillator; and
   a feedback divider ratio adjustment circuit in communication with the adjustable ratio feedback divider circuit to transfer a required ratio change value to the adjustable ratio feedback circuit, wherein the feedback divider ratio adjustment circuit comprises:
      a prescaler that receives an output signal from the voltage controlled oscillator of the phase-locked loop, wherein the prescaler scales a frequency of the output signal of the voltage controlled oscillator by a first integer factor,
      a capture counter that is in communication with the prescaler such that the capture counter is incremented with the scaled output signal,
      a capture register that is clocked by a stable low frequency reference input signal to receive the contents of the capture counter,
      a compare register that is clocked by the stable low frequency reference input signal to increment the capture register by a second integer factor;
      a phase error calculator for subtracting the contents of the compare register from the contents of the capture register to determine a phase error between the output signal of the voltage controlled oscillator and the stable low frequency reference input signal,
      a previous phase error register for retaining a previous phase error that is compared with a current phase error to determine a phase error derivative, and
      a ratio determining circuit in communication with the phase error calculator and the previous phase error register to calculate the required ratio change value from the phase error and the phase error derivative, wherein the required ratio change value is transferred to the adjustable ratio feedback divider circuit for adjusting the feedback divide ratio until the phase-locked loop reaches synchronization.

4. The phase-locked loop of claim 3 wherein the frequency of the voltage controlled oscillator is equal to the product of the first integer factor and the second integer factor multiplied times the frequency of the stable low frequency reference input signal.

5. The phase-locked loop of claim 3 further comprising a sigma delta modulator that receives a feedback signal from the feedback divider circuit that acts as a timing signal for the sigma delta modulator such that the single bit output of the sigma delta modulator is the adjustment signal by which the feedback divider synchronizes the output of the voltage controlled oscillator to the stable low frequency reference input signal.

6. The phase-locked loop of claim 3 wherein the stable low frequency reference input signal is generated by a 32.768 kHz watch crystal.

7. An adjustable ratio feedback divider circuit incorporated in a phase-locked loop in communication with a voltage controlled oscillator of the phase-locked loop to receive an output signal and divide the frequency of output signal by a feedback divide ratio to generate a feedback signal that is applied to a phase-frequency detector and charge pump and compared with the stable high frequency reference signal to generate a phase error that determines a difference in the frequency of the output signal with that of the stable high frequency reference input signal to adjust the voltage controlled oscillator, wherein the adjustable ratio feedback divider circuit comprises:
   a feedback divider ratio adjustment circuit in communication with the adjustable ratio feed back circuit to transfer a required ratio change value to the adjustable ratio feedback circuit, wherein the feedback divider ratio adjustment circuit comprises:

a prescaler that receives an output signal from the voltage controlled oscillator of the phase-locked loop, wherein the prescaler scales a frequency of the output signal of the voltage controlled oscillator by a first integer factor, a capture counter that is in communication with the prescaler such that the capture counter is incremented with the scaled output signal, a capture register that is clocked by a stable low frequency reference input signal to receive the contents of the capture counter, a compare register that is clocked by the stable low frequency reference input signal to increment the capture register by a second integer factor;

a phase error calculator for subtracting the contents of the compare register from the contents of the capture register to determine a phase error between the output signal of the voltage controlled oscillator and the stable low frequency reference input signal, a previous phase error register for retaining a previous phase error that is compared with a current phase error to determine a phase error derivative, and a ratio determining circuit in communication with the phase error calculator and the previous phase error register to calculate the required ratio change value from the phase error and the phase error derivative, wherein the required ratio change value is transferred to the adjustable ratio feedback divider circuit for adjusting the feedback divide ratio until the phase-locked loop reaches synchronization.

8. The adjustable ratio feedback divider circuit of claim 7 wherein the frequency of the voltage controlled oscillator is equal to the product of the first integer factor and the second integer factor multiplied times the frequency of the stable low frequency reference input signal.

9. The adjustable ratio feedback divider circuit of claim 7 wherein the adjustable ratio feedback divider circuit communicates with a sigma delta modulator that receives a feedback signal from the feedback divider circuit that acts as a timing signal for the sigma delta modulator such that the single bit output of the sigma delta modulator is the adjustment signal by which the feedback divider synchronizes the output of the voltage controlled oscillator to the stable low frequency reference input signal.

10. The phase-locked loop of claim 7 wherein the stable low frequency reference input signal is generated by a 32.768 kHz watch crystal.

11. A feedback divider ratio adjustment circuit that determines a scaling ratio for a feedback divider of a phase-locked loop to generate a feedback signal that is a scaled output signal of a voltage controlled oscillator of the phase-locked loop comprising:

a capture counter that is incremented based on a first integer factor (N) of the frequency of the output signal of the voltage controlled oscillator;

a capture register that a stable low frequency reference input signal that is used to clock a capture register to capture the capture count of capture counter and clock the compare register such that it is incremented by a second integer factor;

a phase comparator that receives the contents of the capture register and the compare register and determines a current phase error as the difference between the contents of the capture register and the compare register; and a phase derivative circuit that retains a previous phase error and compares the previous phase error with the current phase error to determine a phase error derivative such that the current phase error and the phase error derivative are then used to determine a required ratio change value is transferred to the feedback divider to adjust the feedback divider ratio until the phase-locked loop reaches synchronization.

12. The feedback divider ratio adjustment circuit of claim 11 wherein the feedback divide ratio is adjusted as a function of a required ratio change value that is a function of a current phase error of the generated frequency of a voltage controlled oscillator and the stable low frequency reference input signal and a phase error derivative.

13. The feedback divider ratio adjustment circuit of claim 11 wherein the phase error derivative is a difference of the current phase error and a previous phase error.

14. The feedback divider ratio adjustment circuit of claim 11 wherein the stable low frequency reference input signal is generated by a 32.768 kHz watch crystal.

15. A method for varying a feedback ratio of a feedback divider of a phase-locked loop comprising the steps of:

prescaling an output signal of a voltage controlled oscillator by dividing the output signal $f_{OUT}$ by a first integer value;

incrementing a capture counter with the prescaled output signal $f_{OUT}$ according to a cycle time of the prescaled output signal;

transferring the value of the capture counter to a capture register with a time interval that is the cycle time of a stable low frequency reference input signal;

increment a compare register with the stable low frequency reference input signal by a second integer factor;

calculating a phase error between the output signal of the voltage controlled oscillator and the stable low frequency reference input signal $f_{LOW}$ by comparing a difference of the contents of the capture register and compare register;

calculating phase error derivative;

calculating a required ratio change value as a function of the current phase error and the phase error derivative;

if the required ratio change value is not zero, adjusting the feedback divide ratio according to the required ratio change value; and when the required ratio change value has reached a zero value, the phase-locked loop is synchronized to the stable low frequency reference input signal.

16. The method claim 15 wherein the frequency of the voltage controlled oscillator is equal to the product of the first integer factor and the second integer factor multiplied times the frequency of the stable low frequency reference input signal.

17. The method of claim 15 wherein the stable low frequency reference input signal is generated by a 32.768 kHz watch crystal.

* * * * *